United States Patent [19]

Bose

[11] Patent Number: 4,563,595
[45] Date of Patent: Jan. 7, 1986

[54] CMOS SCHMITT TRIGGER CIRCUIT FOR TTL LOGIC LEVELS

[75] Inventor: Bidyut K. Bose, Berkeley, Calif.

[73] Assignee: National Semiconductor Corporation, Santa Clara, Calif.

[21] Appl. No.: 546,140

[22] Filed: Oct. 27, 1983

[51] Int. Cl.[4] .......................................... H03K 3/295
[52] U.S. Cl. .................................. 307/290; 307/279; 307/297; 307/359; 307/475
[58] Field of Search ............... 307/451, 452, 469, 475, 307/358, 359, 362, 363, 272 R, 279, 290, 297, 296 R; 330/289, 299, 300

[56] References Cited

U.S. PATENT DOCUMENTS

| | | | |
|---|---|---|---|
| 3,873,856 | 3/1975 | Gerlach et al. | 307/279 |
| 4,281,260 | 7/1981 | Moegen et al. | 307/279 X |
| 4,295,062 | 10/1981 | Mihalich et al. | 307/279 |
| 4,459,494 | 7/1984 | Takakura | 307/279 X |
| 4,464,587 | 8/1984 | Suzuki et al. | 307/279 |
| 4,472,647 | 9/1984 | Allgood et al. | 307/469 X |
| 4,475,048 | 10/1984 | Miyake et al. | 307/279 |

OTHER PUBLICATIONS

Chang et al., "Integrated Delay Circuit/Noise Rejection Circuit", IBM Tech. Disc. Bull., vol. 16, No. 1, Jun. 1973, pp. 317-318.

*Primary Examiner*—Stanley D. Miller
*Assistant Examiner*—D. R. Hudspeth
*Attorney, Agent, or Firm*—Gail W. Woodward; Paul J. Winters; Michael J. Pollock

[57] ABSTRACT

A CMOS Schmitt trigger circuit responsive to TTL logic levels is disclosed. A supply regulator circuit renders the circuit independent of temperature, supply voltage and device parameters.

7 Claims, 5 Drawing Figures

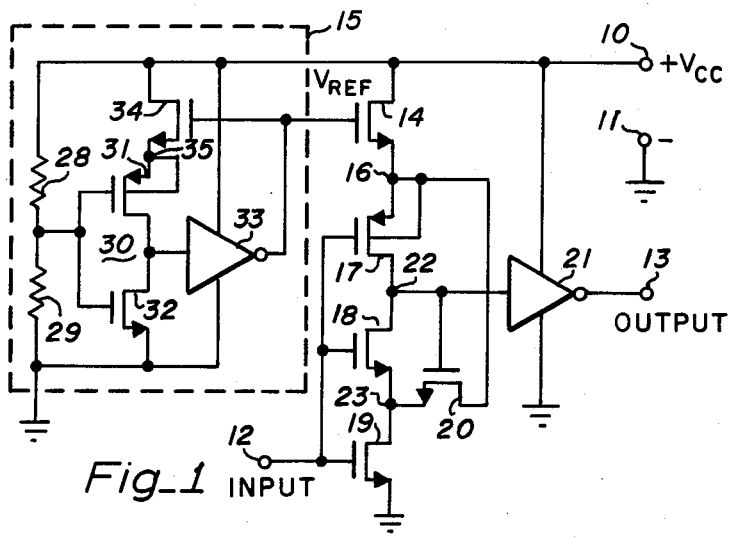
Fig_1
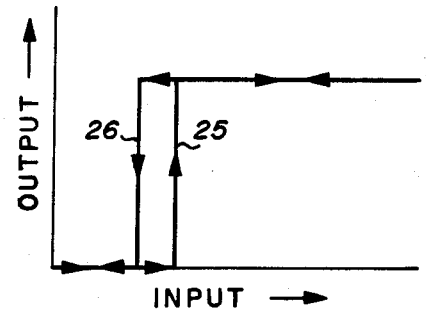
Fig_2
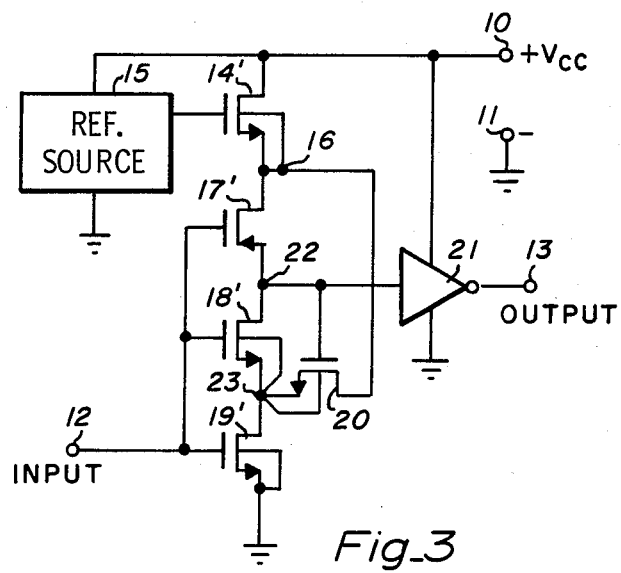
Fig_3
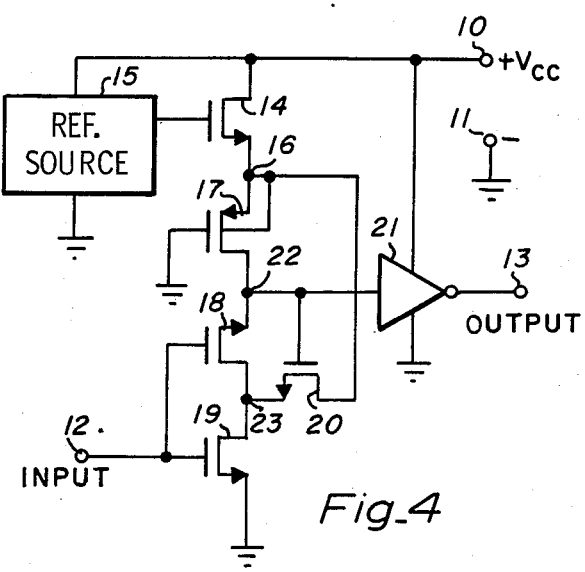
Fig_4
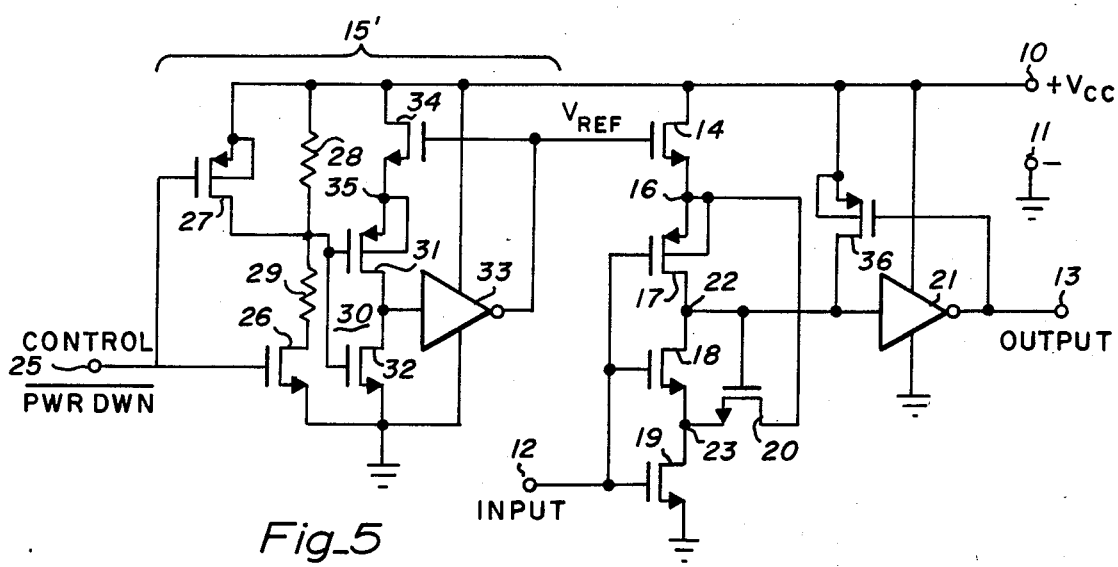
Fig_5

CMOS SCHMITT TRIGGER CIRCUIT FOR TTL LOGIC LEVELS

BACKGROUND OF THE INVENTION

The invention relates to a circuit useful in complementary metal oxide semiconductor (CMOS) structures and is particularly adapted for those involving a large number of gates fabricated into a single chip. Such arrays are known as gate arrays which are useful in fabricating logic circuits in which the gates are interconnected to achieve the desired logic function. Typically a gate array is fabricated into a silicon substrate in a mass produced wafer process. The final metallization, in which the logic function is personalized, is then tailored in accordance with the intended application. In my copending patent application, Ser. No. 321,839, now U.S. Pat. No. 4,430,582, filed Nov. 16, 1981, and titled FAST CMOS BUFFER FOR TTL INPUT LEVELS, now U.S. Pat. No. 4,430,582 a circuit is disclosed for making a large number of CMOS gates in an array conform to transistor-transistor logic (TTL) levels. The teaching in that application is incorporated herein by reference.

One of the problems in CMOS gate arrays is the mass manufacture of gates that respond to the TTL logic levels over a substantial range of power supply voltage, temperature, and transistor parameters. This is particularly true when the gate array includes elements that display hysteresis as found in the Schmitt trigger.

SUMMARY OF THE INVENTION

It is an object of the invention to provide a CMOS Schmitt trigger circuit having hysteresis and responding to the TTL logic levels.

It is a further object of the invention to provide a CMOS Schmitt trigger circuit responsive to TTL logic levels and suitable for incorporation into gate arrays.

It is a still further object of the invention to provide a CMOS gate array Schmitt trigger circuit that displays hysteresis that conforms to TTL logic levels and is functional over a wide range of supply voltage, temperature, and transistor parameters.

These and other objects are achieved in a circuit configured as follows. Four transistors, specifically three N channel and one P channel, are coupled in series across the supply voltage input. The first N channel transistor has its drain coupled to the $+V_{CC}$ rail and its gate is coupled to a source of reference voltage of the kind disclosed in my U.S. Pat. No. 4,430,582. The source of the first N channel transistor comprises the supply node for the Schmitt trigger. The remaining two N channel transistors have their gates coupled to the circuit input terminal. The P channel transistor has its source coupled to the source of the first N channel transistor and it acts as the load element for the second and third series connected N channel transistors with the P channel transistor drain comprising the hysteresis node. The P channel transistor gate is either grounded or coupled to the input terminal. A fourth N channel transistor has its source coupled to the juncture of the second and third N channel transistors and its drain is coupled to the juncture of the first N channel and the P channel transistor sources. The gate of the fourth N channel transistor is coupled to the hysteresis node. A conventional inverter is coupled between the hysteresis node and the circuit output terminal to provide a rail to rail output swing.

BRIEF DESCRIPTION OF THE DRAWING

FIG. 1 is a schematic diagram of an N well CMOS Schmitt trigger circuit.

FIG. 2 is a graph showing the operation of the circuit of FIG. 1.

FIG. 3 is a schematic diagram of a P well CMOS Schmitt trigger circuit.

FIG. 4 is a schematic diagram of an alternative N well CMOS Schmitt trigger circuit.

FIG. 5 is a schematic diagram of the circuit of FIG. 1 with a power down feature added.

DESCRIPTION OF THE INVENTION

With reference to the schematic diagram of FIG. 1 a compensated Schmitt trigger circuit is shown. The circuit operates from a $V_{CC}$ power supply connected + to terminal 10 and − to ground terminal 11. Since the circuit is to be compatible with TTL logic, this supply is ordinarily $5 \pm 0.5$ volts. The circuit shown is for N well CMOS construction in which the P channel transistors have individual back gate connections as shown. All of the N channel transistor back gates (not shown) are connected to the substrate which is grounded. Input terminal 12 responds to the preceding logic circuitry which is at TTL levels. In this logic family a logic one is typically in excess of 2 volts and a logic zero is less than 0.8 volt. Output terminal 13 which swings substantially rail-to-rail, or zero to five volts, responds as a noninverting buffer with hysteresis to input terminal 12.

N channel transistor 14, which has its gate returned to a reference source 15, supplies current to node 16. This part of the circuit operates in accordance with the teaching in U.S. Pat. No. 4,430,582. The voltage at node 16 is regulated to make the inverter gates in a gate array operate with TTL logic inputs and to make them operate substantially independent of temperature, supply voltage and transistor parameters. While node 16 is shown connected to a single Schmitt trigger circuit it is to be understood that a single transistor 14 and reference source 15 could supply a plurality of similar trigger circuits. It is only necessary that transistor 14 be made large enough to handle the combined currents of the plural trigger circuits.

$V_{REF}$ is obtained as follows. Resistors 28 and 29 form a voltage divider across the power supply. They are proportioned so that about 1.4 volts is applied to the input of inverter 30. Transistors 31 and 32 are proportioned so that a 1.4 volt input produces a $V_{CC}/2$ output or about 2.5 volts. Inverter 33 is designed to act as a level shifter so that its output is close to $V_{CC}$. Transistor 34 which acts as a source follower supplies operating current to inverter 30. Thus a negative feedback loop exists around inverter 30 which is operated against a 1.4 volt reference. The potential at node 35 will adjust the circuit operating point so that the inverter 30 will be in its high gain states or active, at the TTL logic reference level. If node 35 is connected to supply a number of similar logic gates in an array, they all will be compensated for variations in temperature, supply voltage and device parameters.

The Schmitt trigger circuit itself is made up of transistors 17–20 and inverter 21. N channel transistors 18 and 19 together form a CMOS inverter with P channel transistor 17. The gates of all three devices are returned to input terminal 12. N channel transistor 20 is coupled between nodes 16 and 23 with its gate returned to node 22 which could be described and the hysteresis node. The graph of FIG. 2 portrays the operation of the circuit of FIG. 1.

When the input at terminal 12 is zero transistors 18 and 19 are off and node 22 is pulled high by transistor 17. Due to the action of inverter 21 the output at terminal 13 is low or close to zero. Since node 22 is high transistor 20 will be on and will pull node 23 high. As the input rises transistor 19 will turn on first at an input of $V_{TN}$, or one N channel transistor threshold, and start to pull node 23 down. At this point transistors 19 and 20 act as a voltage divider. As the input continues to increase node 23 will be pulled lower and at some point transistor 18 will turn on. When this occurs transistors 18-20 form an active high gain regenerative loop that will rapidly pull node 22 down as a function of the rising input. The output of inverter 21 will suddenly snap up close to $+V_{CC}$. This produces transition 25 of FIG. 2. The parameters of transistors 18-20 are selected so that transition 25 occurs at close to 1.6 volts which is below the TTL logic one but higher than the TTL logic reference of 1.4 volts. As the input is increased further the output will remain at $+V_{CC}$. Note the left to right arrows in the graph of FIG. 2. At this output high point transistors 18 and 19 are on while transistors 17 and 20 are off. Nodes 22 and 23 are low.

When the input is swung from high to low at terminal 12 the right to left arrows of FIG. 2 are invoked. The input will drop until the threshold of the inverter formed by transistors 17-19 is reached. At this point transistor 17 will pull node 22 up to where transistor 20 turns on to engender transition 26 of FIG. 2. During this transition transistors 17-20 form a regenerative combination that acts to rapidly pull nodes 22 and 23 high. As node 23 rises it will turn transistor 18 off so as to allow transistor 17 to snap node 22 high. Inverter 21 responding to node 22 produces a logic zero at terminal 13. The parameters of transistors 17-19 are selected so that transition 26 occurs at about 1.1 volts which is higher than a TTL logic zero of 0.8 volt but lower than the TTL logic reference of 1.4 volts.

From the above it can be seen that the circuit hysteresis is 0.5 volt. Simulation of the circuit of FIG. 1 shows that over the temperature range of $-40°$ C. to $105°$ C., the supply voltage range of 4.5 to 5.5 and the maximum processing variables that affect transistor threshold values, transition 25 occurred at 1.6 volts $\pm 0.35$ volt, transition 26 occurred at 1.1 volts $\pm 0.25$ volt, and the hysteresis voltage varied over the range of 0.3 volt minimum to slightly over 1 volt maximum.

Thus, the circuit parameters remained acceptable over these variations.

FIG. 3 shows the invention embodied in CMOS P well construction. In this form of construction all of the P channel transistors back gates (not shown) are returned to the substrate which is connected to $+V_{CC}$. N channel transistors 14', 18', 19', and 20' have their back gates returned to their sources. This eliminates body effect in these N channel transistors. In turn this simplifies the ratioing of transistors 19' and 20' which controls the potential present at node 23. It furthermore permits scaling transistors 17'-20' up so as to increase the circuit speed. In such scaling the W/L ratios should be maintained so that the transitions 25 and 26 of FIG. 2 are unchanged.

FIG. 4 shows an alternative N well CMOS construction embodiment of the invention. The circuit is similar to that of FIG. 1 except that the gate of transistor 17 is grounded. This means that transistor 17 is always turned on so that it acts as a resistor. Thus when transistor 18 is off, node 22 will be pulled up towards node 16.

FIG. 5 illustrates the embodiment of FIG. 1 with a power down circuit added. Terminal 25 has been added to control the circuit operation. $\overline{\text{PWR DWN}}$ is applied to terminal 25 so that it is normally high. This turns transistor 26 on and transistor 27 off. Thus, circuit 15' will operate normally as did circuit 15 of FIG. 1. The value of $V_{REF}$ at the output of inverter 33 will adjust $V_{REF}$ for TTL signal input levels. N channel transistor 26 is ratioed to provide a negligible "on" resistance compared to resistors 28 and 29.

When the $\overline{\text{PWR DWN}}$ signal at terminal 25 goes low, for a power down condition, transistor 26 turns off and transistor 27 turns on. This pulls the input to inverter 30 high so that the output from inverter 33 also goes high. As a result of this action, node 35 is pulled close to $+V_{CC}$ by conduction in transistor 34. Since conduction in transistor 27 has pulled the gate of transistor 31 high it will be off so that inverter 30 will not pass any current. Thus inverter 30, and therefore circuit 15', is disabled by pulling its input high. The input to inverter 33 is so low that it does not draw any power either.

In the power down state node 16 will also be close to $+V_{CC}$. The currents passed by the Schmitt triggers connected to node 16 will then be determined by their input states. For example, if the trigger input terminal 12 is returned to $+V_{CC}$ through a conventional pull up device, transistor 17 will be turned off so that no power drain occurs. This action will also turn transistors 18 and 19 on so that node 22 will be pulled low. If terminal 12 is returned to ground by means of a conventional pull down device, transistors 18 and 19 will be off so that no current flows and transistor 17 will be on so as to pull node 22 high. However, since node 22 has two series transistors to $+V_{CC}$ it might not go sufficiently close to $V_{CC}$ to turn inverter 21 completely off. For this reason transistor 36 is added to inverter 21 to form a soft latch. When terminal 13 goes low it turns transistor 36 on so as to pull node 22 sufficiently close to $+V_{CC}$ to fully turn inverter 21 off.

The invention has been described and several embodiments detailed. When a person skilled in the art reads the foregoing description, alternatives and equivalents, within the spirit and intent of the invention, will become apparent. Accordingly, it is intended that the invention be limited only by the claims that follow.

I claim:

1. In a CMOS inverter gate connectable to a source of operating power and configured to produce a hysteresis response to an input signal about a predetermined TTL reference voltage input level of about 1.4 volts, said hysteresis response having a low to high logic voltage transition that is below a prescribed logic high state of about 2 volts and a high to low logic voltage transition that is above a prescribed logic low state of about 0.8 volt thereby to create a Schmitt trigger circuit function, the improvement comprising:

a power source regulator connected between said inverter gate and said source of operating power and responsive to a reference potential obtained from a CMOS inverter gate that is biased at an input potential substantially equal to said predetermined reference voltage input level.

2. The improvement of claim 1 wherein said power source regulator supplies a plurality of Schmitt trigger circuits.

3. A CMOS Schmitt trigger circuit having input and output terminals, first and second supply rails connectable to a source of operating power and a hysteresis node, said circuit comprising:

first and second N channel transistors having their source drain circuit coupled in series between said hysteresis node and said second supply rail and their gates coupled to said input terminal;

a third P channel transistor having its source drain circuit coupled between said hysteresis node and said first supply rail, and its gate coupled to said input terminal;

a fourth N channel transistor having its source drain circuit coupled between said first supply rail and the juncture of said first and second transistors, and its gate coupled to said hysteresis node;

an inverter coupled between said hysteresis node and said output terminal; and a fifth P channel transistor having its source drain circuit coupled between said hysteresis node and said first supply rail and its gate coupled to said inverter output whereby said hysteresis node has a high to low transition for an input terminal voltage that is substantially higher than the input terminal voltage that produces a low to high transition.

4. The circuit of claim 4 further including a sixth N channel transistor having its source drain circuit coupled in series between said third transistor source and said first supply rail and a gate returned to a source of reference potential that regulates the potential applied to said Schmitt trigger circuit.

5. The circuit of claim 8 wherein said reference potential is regulated against a potential of about 1.4 volts whereby said Schmitt trigger is responsive to TTL levels and hysteresis is adequate for the expected noise levels in CMOS gate arrays.

6. The circuit of claim 8 further including a power down circuit responsive to a control logic input whereby said reference potential is caused to rise to substantially the level of said first rail when said power down is invoked whereby said Schmitt trigger circuit is turned off.

7. A CMOS Schmitt trigger circuit having input and output terminals, first and second supply rails connectable to a source of operating power and a hysteresis node, said circuit comprising:

first and second N channel transistors having their source drain circuits coupled in series between said hysteresis node and said second supply rail and their gates coupled to said input terminal;

a third P channel transistor having its source drain circuit coupled between said hysteresis node and said first supply rail, and its gate coupled to said second supply rail;

a fourth N channel transistor having its source drain circuit coupled between said first supply rail and the juncture of said first and second transistors, and its gate coupled to said hysteresis node;

an inverter coupled between said hysteresis node and said output terminal; and a fifth P channel transistor having its source drain circuit coupled between said hysteresis node and said first supply rail and its gate coupled to said inverter whereby said hysteresis node has a high to low transition for an input terminal voltage that is substantially higher than the input terminal voltage that produces a low to high transition.

* * * * *